United States Patent [19]
Rybicki et al.

[11] Patent Number: 4,791,405
[45] Date of Patent: Dec. 13, 1988

[54] DATA CONVERTER FOR DIRECTLY PROVIDING OUTPUTS IN TWO'S COMPLEMENT CODE

[75] Inventors: Mathew A. Rybicki, Austin; James A. Miller, Pflugerville, both of Tex.; Ted A. Biggs, deceased, late of Houston, Tex., by Jane G. Biggs, James K. Biggs, Jr., heirs

[73] Assignee: Motorola, Inc., Schaumburg, Ill.

[21] Appl. No.: 935,867

[22] Filed: Nov. 28, 1986

[51] Int. Cl.$^4$ ............................................. H03M 1/38
[52] U.S. Cl. .................................. 341/158; 307/360; 307/361; 341/172
[58] Field of Search ....... 340/347 AD, 347 C, 347 M, 340/347 DA; 307/360, 361

[56] References Cited

U.S. PATENT DOCUMENTS 3,403,393  9/1968  Skrenes ..................... 340/347 DA
4,473,818  9/1984  Younquist .................. 340/347 M X

OTHER PUBLICATIONS

Gray et al., Companded Pulse-Code Modulation Voice Codec-, IEEE Journal of Solid-State Circuits, vol. SC-10, No. 6, 12/1975, pp. 497-499.
The Engineering Staff of Analog Devices, Inc., Analog-Digital Conversion Handbook, 6/1972, pp. II-16 to II-25; II-32 to II-35; & II-46 to II-49.
McCreary et al., All-Mos Charge Redistribution Analog-To-Digital-, IEEE Journal of Solid-State Circuits, vol. SC-10, No. 6, 12/1975, pp. 371-379.
Sklar, 2's Complement Arithmetic Operations, Computer Design, vol. 11, No. 5, 5/1972, pp. 115-121.

Primary Examiner—T. J. Sloyan
Attorney, Agent, or Firm—John A. Fisher; Jeffrey Van Myers; Robert L. King

[57] ABSTRACT

A method for directly providing a conversion of an analog input signal to a digital signal in two's complement code with a sampled data converter. Positive and negative reference voltages and an analog ground voltage are required. After a sign bit determination of the input signal is made, the data converter is coupled between either a first pair of reference voltages or a second pair of reference voltages depending upon the sign bit. The first pair of reference voltages comprises the positive reference and ground reference, and the second pair of reference voltages comprises the ground reference and a negative reference. By selectively coupling the chosen reference voltages to the converter, a converter may directly output two's complement code.

7 Claims, 3 Drawing Sheets

DATA CONVERTER FOR DIRECTLY PROVIDING OUTPUTS IN TWO'S COMPLEMENT CODE

TECHNICAL FIELD

This invention relates generally to A/D and D/A sampled data converter circuits, and more particularly, to two's complement A/D and D/A converters.

BACKGROUND ART

Charge redistribution data converters are commonly used to convert bipolar (i.e. two polarities) analog signals into a digital code that retains sign information. A variety of bipolar digital codes may be used when digitally representing bipolar analog signals as discussed in *Analog-Digital Conversion Handbook* by The Engineering Staff of Analog Devices (Analog Devices, Inc., 1976, pages II-17 to II-25). A common digital code used to represent bipolar analog signals in charge redistribution data converters is sign magnitude. Another frequently implemented digital code is offset binary. Digital signal processing (DSP) circuits are often designed to process operands in two's complement form because processing operands in two's complement form is fast and efficient for particular arithmetic operations. Because charge redistribution circuits typically utilize a digital bipolar code other than two's complement, a conversion from one of several common bipolar digital codes must be made. Mathematically, to convert from sign magnitude code to two's complement code a check of the most significant bit (MSB) must be made. If the MSB is a logic "one", the remaining bits must be complemented and a logic "one" added to the sign magnitude code. If the MSB is a logic "zero", no conversion has to be made. Previously, conversion of data from one of several bipolar digital codes to two's complement code has been implemented by either utilizing additional digital circuitry which converts a predetermined bipolar code provided by a converter into two's complement code or by using a software program which is executed by the processor which the A/D converter is supporting. However, the additional conversion circuitry utilizes integrated circuit area which is typically not cost effective, and the software program requires processor time which may be more effectively utilized and which creates delay in the conversion process.

Mathematically, offset binary code is easier to convert to two's complement code than sign magnitude code because the conversion is made by merely complementing the MSB. However, offset binary code always requires the use of the MSB to provide sign information. In sign magnitude code, by knowing whether a positive reference voltage or a negative reference voltage is being used by the converter circuit, the sign of the output signal is automatically known. Therefore, the MSB in sign magnitude code may be used for magnitude information rather than sign information. As a practical matter, only eleven bits are used in a twelve-bit converter for magnitude data in offset binary code. In contrast, all twelve bits may be used for magnitude data in sign magnitude code thereby allowing an extra bit of resolution. Therefore, an extra bit of resolution always exists for any given size of converter using sign magnitude code.

In order to implement a converter of predetermined resolution, twice the area is required in offset binary code as opposed to sign magnitude or two's complement code. In high-order converters using offset binary code, the addition of an extra bit of resolution requires a substantial increase in converter size. For example, in a capacitive offset binary code converter twice the number of capacitors is required to implement an extra bit of resolution. Further, since converters which implement offset binary code use two reference voltages and no fixed ground voltage, a zero input level may not correspond to a zero output code if the positive and negative reference voltages are not symmetrical with respect to a ground reference. An inaccurate zero reference level may create an unacceptable pedestal when a zero input level is applied. Therefore, data converters which provide binary codes do not typically readily provide outputs in two's complement code.

BRIEF DESCRIPTION OF THE INVENTION

Accordingly, an object of the present invention is to provide an improved data converter for providing a data output in two's complement form.

Another object of the present invention is to provide an improved method for converting data in analog form to digital two's complement code in charge redistribution data converters.

A further object of the present invention is to provide a data conversion method for converting data operands from analog form to two's complement code with speed and size characteristics improved over previously known methods.

In carrying out the above and other objects of the present invention, there is provided, in one form, a charge redistribution data conversion system for receiving an analog input voltage and converting the received analog input voltage to a digital output in a predetermined digital binary code. The present invention provides a method for switching first and second reference voltages of a predetermined data converter to directly provide an output in two's complement code thereby avoiding a conversion from another binary code to two's complement code. The analog input voltage is received by the data conversion system and stored. The stored input voltage is compared with a predetermined first reference voltage to provide an output sign bit of the digital output voltage. In response to the output sign bit, the charge storage data conversion system is coupled between either a first pair or a second pair of reference voltages. The first pair of reference voltages comprises a second reference voltage and the first reference voltage, and the second pair of reference voltages comprises the first reference voltage and a third reference voltage. The present invention may also permit an N-bit data converter, where N is an integer, providing digital output data in another binary code such as offset binary to be adapted to directly output digital data in two's complement code and provide (N+1) bits without any structural modification.

These and other objects, features and advantages will be more clearly understood from the following detailed description taken in conjunction with the accompanying drawings.

DETAILED DESCRIPTION OF THE INVENTION

Figure 1:
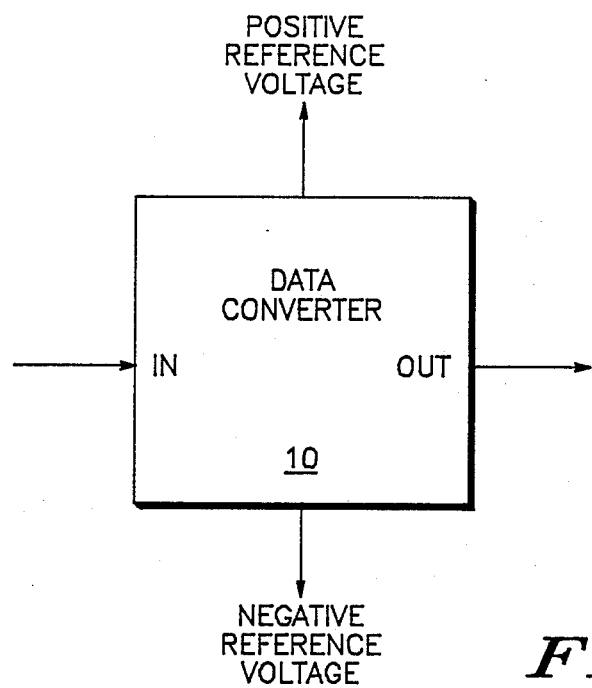
FIG. 1 illustrates in block diagram form, a conventional N-bit analog-to-digital data converter operating in offset binary code, where N is an integer.

Shown in FIG. 1 is an N-bit data converter 10 known in the art, where N is an integer. Data converter 10 is illustrated in block diagram form and provides digital output data in a bipolar code such as offset binary code after receiving an analog input signal. A positive reference voltage and a negative reference voltage are coupled to data converter 10. Any one of many known converter circuit structures may be used to implement data converter 10 in conjunction with the positive and negative reference voltages.

Figure 2:
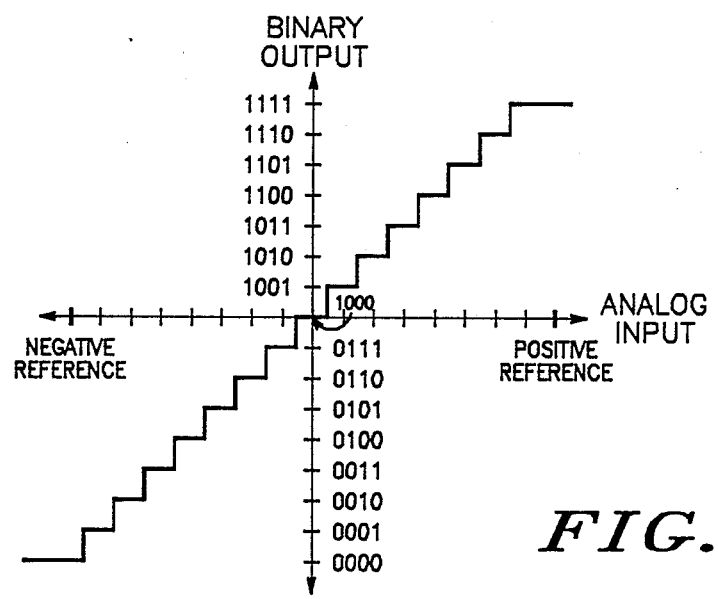
FIG. 2 illustrates in graphical form an N-bit offset binary coded transfer curve, where N equals four.

Shown in FIG. 2 is an N-bit offset binary code transfer curve, where N is equal to four. The transfer curve illustrates a range of four-bit length binary output signal values which are correlated with a range of analog input signal values varying from a negative reference value to a positive reference value. In offset binary code, the digital values increase incrementally by one from the value 0000 to 1111. The MSB is a sign bit where a logic "zero" indicates that the value of the binary output signal is a negative polarity and a logic "one" indicates that the value is a positive polarity. The zero value or crossover point at which the output signal changes between positive and negative polarity is represented by the single value 1000. Since a single digital value represents "zero", no crossover distortion occurs in offset binary code when transitioning between negative and positive valued analog input values. To implement the offset binary code, two reference voltages are required wherein one reference voltage has a negative polarity and the other reference voltage has a positive polarity. The zero value which is correlated with an unknown analog input signal is therefore half-way between the positive and negative reference voltage values.

In the illustrated form, it should be readily apparent that the offset binary code illustrated in FIG. 2 may be implemented by any one of many known charge redistribution data converters which uses two reference voltages. For example, data converter 10 may be implemented by a capacitive D/A or A/D converter structure or by a resistive-capacitive D/A or A/D converter structure. However, when previous data converters configured as data converter 10 are required to provide a two's complement code, an additional conversion from a binary code such as offset binary or sign-magnitude to two's complement code is required.

Figure 3:
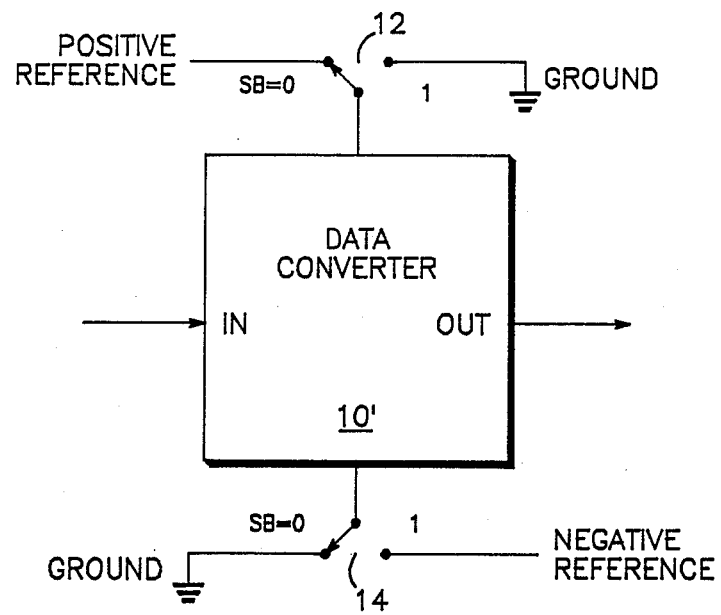
FIG. 3 illustrates in block diagram form, the analog-to-digital data converter of FIG. 1 modified to directly provide an (N+1) bit output in two's complement binary code in accordance with the present invention.

Shown in FIG. 3 is a data converter 10' in accordance with the present invention. Data converter 10' is also illustrated in block diagram form, but unlike data converter 10, converter 10' directly provides digital output data in two's complement code in response to receiving an analog input signal. It should be noted that the same sampled data converter may be assumed to exist within the illustrated block in both FIG. 1 and FIG. 3 for data converters 10 and 10', respectively. Data converter 10' also requires the use of two reference voltages where one reference voltage is a positive voltage value and the other reference voltage is a negative voltage value. However, a third reference voltage is provided for use with data converter 10'. The third reference voltage is a fixed analog ground or ground potential. The value of the analog ground is substantially halfway between the positive and negative reference voltage values so that the ground reference has a neutral polarity. A switch 12 has a first terminal coupled to data converter 10'. A second terminal of switch 12 is coupled to either the positive reference voltage or to the ground reference potential. A control terminal of switch 12 is coupled to a sign bit control signal labeled "SB". A switch 14 has a first terminal coupled to data converter 10'. A second terminal of switch 14 is coupled to either the ground reference potential or to the negative reference voltage. A control terminal of switch 14 is coupled to the sign bit control signal SB.

In operation, an analog input signal of unknown magnitude and sign is coupled to an input terminal of data converter 10'. An initial sign bit determination is made of the input analog signal and in response to the sign value, switches 12 and 14 couple data converter 10' between predetermined voltage values. When the sign bit is a logic "zero" indicating a positive sign, data converter 10' is coupled between analog ground potential and the positive reference by switches 14 and 12, respectively. When the sign bit is a logic "one" indicating a negative sign, data converter 10' is coupled between the negative reference and analog ground potential by switches 14 and 12, respectively. A converted digital output value of the unknown analog input in two's complement code is directly provided at an output terminal of data converter 10'.

Figure 4:
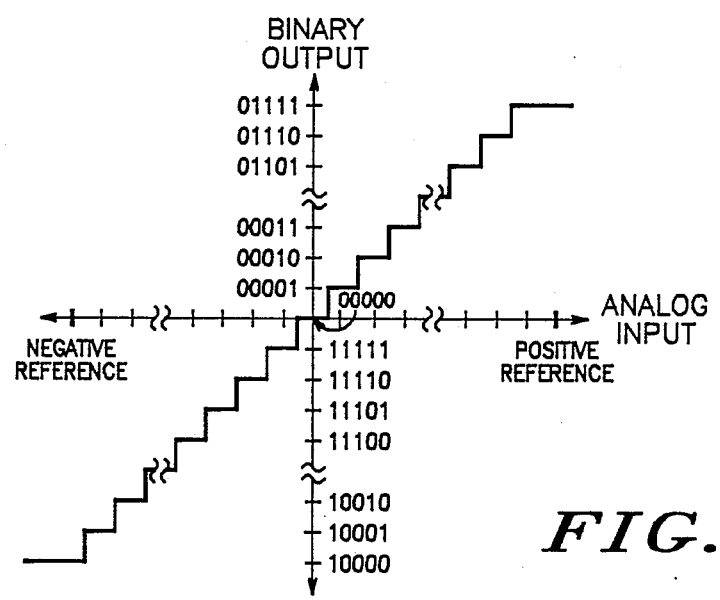
FIG. 4 illustrates in graphical form the (N+1) bit two's complement code.

Shown in FIG. 4 is a graph illustrating the two's complement binary code provided by data converter 10' as a result of the switching action of switches 12 and 14. As can be readily noted from FIG. 4, the two's complement code has (N+1) or five bits of resolution illustrated rather than four bits. The reason for the extra bit of resolution will be explained below. The two's complement code has the inherent characteristic of correlating with offset binary code with the exception of the MSB. As a result, when others have converted from offset binary code at the output of converter 10 of FIG. 1 to two's complement code, the MSB of the output was inverted to provide the output in two's complement form. However, since offset binary code requires a sign bit, only three bits out of four bits are used for magnitude. By switching reference voltages to data converter 10' in accordance with the value of the sign bit as explained below, the present invention allows four bits to be used for magnitude with the identical converter structure. As previously mentioned, many converters are implemented to provide sign magnitude code to obtain additional precision without increasing circuit size. To convert from sign magnitude code to two's complement code, an inversion of all magnitude bits and an addition of a binary "one" must be implemented if the sign bit is a binary "one". This conversion to two's complement code requires more circuitry to implement than the conversion from offset binary.

In the illustrated graph of FIG. 4, it should be noted that two's complement code inherently consists of two binary coded segments comprising a segment above the digital zero level and a segment below the digital zero level. Except for the sign bit, these two segments are identical with the positive valued segment beginning at the analog ground reference and the negative value segment beginning at the negative reference value. Both of these segments represent unipolar binary codes and are capable of being generated independently by either data converter 10 or data converter 10'. Therefore, by varying the reference voltage levels which data converter 10' operates between, each independent segment of two's complement code may be shifted and provided by data converter 10'. When the sign bit is a logic "zero", data converter 10' is allowed to operate between the positive reference voltage and the ground reference voltage to provide positive value digital outputs. When the sign bit is logic "one", data converter 10' is allowed to operate between the ground reference voltage and the negative reference voltage. The sign bit is reset if the analog input voltage is greater than ground potential and is set if the analog input voltage is less than ground potential. It should be well understood that data converter 10' may also be used in conjunction with the present invention to provide an analog output voltage in response to a digital input voltage. In other words, the present invention is equally applicable to D/A converters as to A/D converters.

Figure 5:
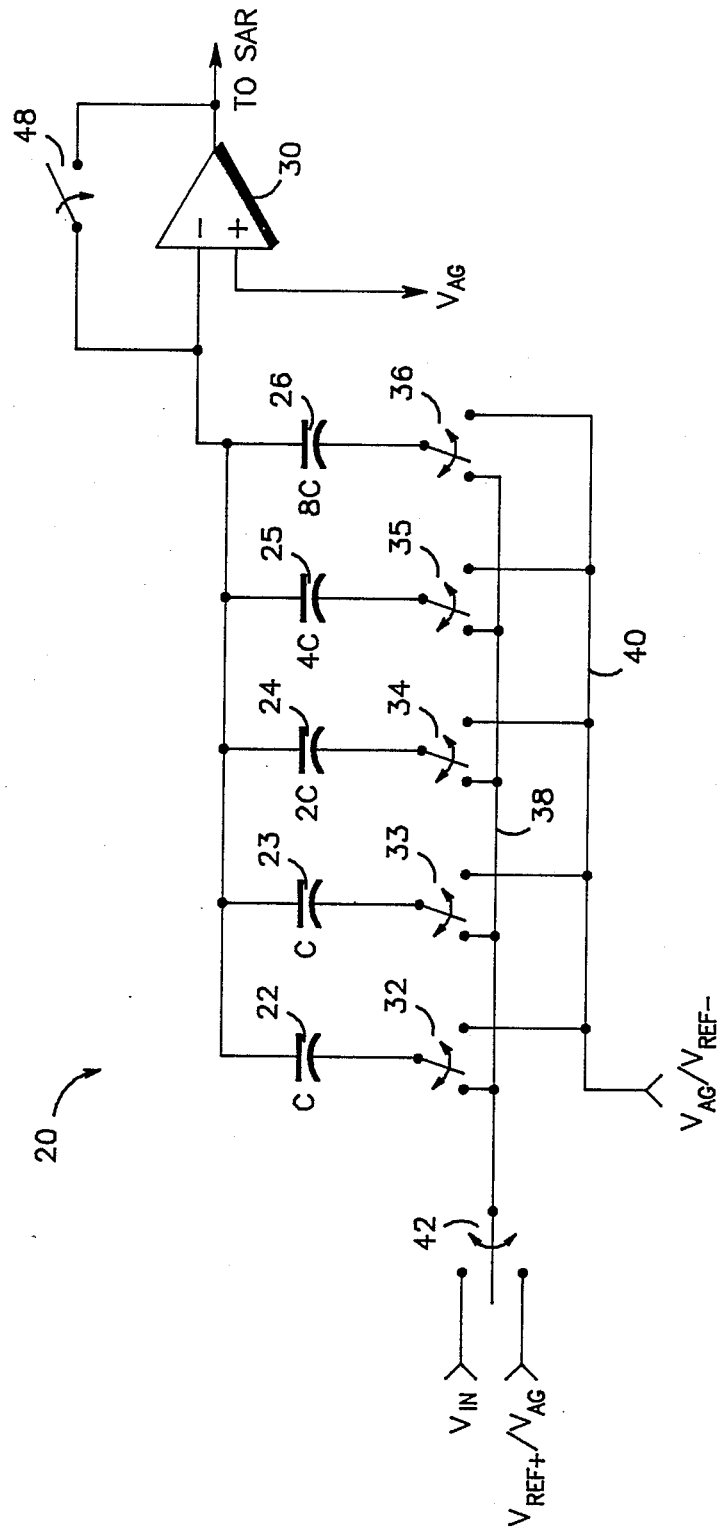
FIG. 5 illustrates in partial schematic form a data converter operating in two's complement code in accordance with the present invention.

Shown in FIG. 5 is one of many possible implementations of a data converter 20 which may be used to practice the present invention. Data converter 20 comprises a plurality of rank ordered binarily weighted capacitors 22-26 having capacitive values of C, C, 2C, 4C and 8C, respectively. Each of capacitors 22-26 has a first electrode connected together and connected to an inverting input of an operational amplifier 30. A noninverting input of operational amplifier 30 is connected to an analog ground voltage potential, $V_{AG}$. An output of operational amplifier 30 is connected to a conventional SAR. Although an SAR is not expressly illustrated in FIG. 5, an SAR is understood to be incorporated in both converter 10 and converter 10'. Each of capacitors 22-26 also has a second electrode connected to a first terminal of one of switches 32-36, respectively. The first terminal of each of switches 32-36 is connected to either a first voltage bus 38 or a second voltage bus 40 in response to control signals provided by the successive approximation register not shown. First voltage bus 38 is connected to a first terminal of a switch 42. A second terminal of switch 42 is connected to either an analog input voltage or to one of a positive reference voltage, $V_{REF+}$, or analog ground, $V_{AG}$. Second voltage bus 40 is connected to either analog ground, $V_{AG}$, or to a negative reference voltage, $V_{REF-}$. The inverting input of operational amplifier 30 is connected to a first terminal of a switch 48, and a second terminal of switch 48 is connected to the output of operational amplifier 30.

In the illustrated form, data converter 20 may be used as either an A/D converter or a D/A converter. When in the A/D mode, an analog input voltage $V_{IN}$ is switched to voltage bus 38 and coupled to each of capacitors 22-26. The input voltage is charge shared onto each capacitor. During this time, switch 48 is conductive to place operational amplifier 30 in a unity gain mode. After a sufficient sampling time has elapsed, switch 48 becomes nonconductive which determines the sampling instant of the input voltage. Input voltage $V_{IN}$ is then disconnected. Each of switches 32-36 is switched to voltage bus 40 which is initially connected to $V_{AG}$ and a sign bit determination is performed. Operational amplifier 30 functions as a comparator and compares the voltage potential at the inverting input thereof and provides an output of either logic high or logic low level indicating the sign of the sampled input voltage. Depending upon the logic level of the sign bit, one of $V_{REF+}$ or $V_{AG}$ is selected to be coupled to switch 42, and one of $V_{AG}$ or $V_{REF-}$ is selected to be connected to voltage bus 40. As previously mentioned, if the sign bit provided by operational amplifier 30 is "zero", reference voltage $V_{REF+}$ is chosen for use with switch 42 and reference voltage $V_{AG}$ is connected to voltage bus 40. If the sign bit is "one", reference voltage $V_{AG}$ is chosen for use with switch 42 and reference voltage $V_{REF-}$ is connected to voltage bus 40.

After a sign bit determination is made, a conventional A/D conversion utilizing an SAR is made. Switch 36 is connected to voltage bus 38 and all other switches remain connected to voltage bus 40. If the output of operational amplifier 30 indicates that the switched approximation voltage is too large, switch 36 is connected back to voltage bus 40 and switch 35 is connected to voltage bus 38 with all other switches remaining connected to voltage bus 40. A conventional successive approximation is continued by the external SAR in response to the output of operational amplifier 30 until the switch positions of switches 32-36 approximate a digital representation of the analog input voltage. A digital output which may be obtained from the switch positions of switches 32-36 is automatically in two's complement code and needs no additional conversion. In contrast, if voltage busses 38 and 40 are connected to only $V_{REF+}$ and $V_{REF-}$, respectively, the digital output would be in offset binary code having one less bit and a conversion to two's complement form would be necessary. Similarly, if voltage bus 40 is connected to $V_{AG}$ and voltage bus 38 is alternated between a positive and a negative reference voltage in response to the sign bit, the digital output is in sign magnitude code and needs additional conversion to two's complement code.

By now it should be apparent that a method for converting an analog signal directly to a digital two's complement code in a sampled data converter system has been provided. By directly providing a two's complement digital output with a converter which otherwise would provide another binary code, circuitry and conversion time is minimized. The present invention may be applied to either all capacitive, all resistive or a combination of capacitive and resistive sampled data systems. When implementing the present invention in a resistive converter structure, the reference voltages should be applied to either end of a resistor string in a manner to minimize a voltage drop across any switching device which may be used to couple the reference voltages to the resistor string. Any voltage errors coupled to the converter when coupling the ground reference may create crossover distortion for the converter, whereas any voltage errors coupled to the converter when coupling the positive or negative references may create precision error. However, when properly compensated, the switches used to couple the reference voltages to the converter do not degrade the converter's performance.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. In a data conversion system for receiving an analog input voltage and converting the received analog input voltage to a digital output code in a predetermined binary code, a method of configuring the data conversion system to directly provide the predetermined binary code as two's complement binary code, comprising the steps of:

receiving the input voltage;

comparing the input voltage with a predetermined first reference voltage to provide an output sign bit of the digital output voltage; and selectively coupling first and second reference voltage terminals of the data conversion system between either a first pair of reference voltages or a second pair of reference voltages in response to the output sign bit, the first pair of reference voltages comprising a second reference voltage coupled to the first reference voltage terminal and the first reference voltage coupled to the second reference voltage terminal, and the second pair of reference voltages comprising the first reference voltage coupled to the first reference voltage terminal and a third reference voltage coupled to the second reference voltage terminal.

2. The data conversion system of claim 1 wherein the third reference voltage is a predetermined negative voltage value, the second reference voltage is a predetermined positive voltage value, and the first reference voltage is a voltage level having a value substantially one-half between the positive and negative voltage values.

3. The data conversion system of claim 1 wherein the data conversion system is a charge redistribution conversion system.

4. In a data conversion system for receiving an analog input voltage and converting the received analog input voltage to a digital output in offset binary code, a method of changing digital code format of the data conversion system from offset binary code to two's complement code, comprising the steps of:

receiving the input voltage;

comparing the stored input voltage with a first reference voltage to provide an output sign bit of the digital output voltage; and selectively coupling first and second reference voltage terminals of the data conversion system between either a first pair of reference voltages or a second pair of reference voltages in response to the output sign bit, the first pair of reference voltages comprising a second reference voltage coupled to the first reference voltage terminal and the first reference voltage coupled to the second reference voltage terminal, and the second pair of reference voltages comprising the first reference voltage coupled to the first reference voltage terminal and a third reference voltage coupled to the second reference voltage terminal, said third reference voltage having a magnitude substantially equal to a magnitude of the first reference voltage and of opposite polarity to the first reference voltage.

5. The data conversion system of claim 4 wherein the data conversion system is coupled to the first pair of reference voltages in response to the input sample voltage having a positive sign and to the second pair of reference voltages in response to the input sample voltage having a negative sign.

6. In a capacitive data conversion system for selectively receiving an analog input voltage and storing the input voltage via a plurality of parallel coupled capacitors, a method of providing a digital output signal in two's complement code, comprising the steps of:

comparing the stored input voltage with a predetermined first reference voltage to provide an output sign bit of the digital output signal;

selectively coupling each of the capacitors to one of two reference voltage terminals, said first reference voltage terminal receiving either a second reference voltage or the first reference voltage while said second reference voltage terminal respectively receives the first reference voltage or a third reference voltage; and performing a successive approximation of the stored input voltage to provide the digital output signal in two's complement code.

7. The capacitive data conversion system of claim 6 wherein the first reference voltage is an analog ground reference, the second reference voltage is a positive reference voltage, and the third reference voltage is a negative reference voltage

* * * * *